United States Patent
Chowdhury et al.

(10) Patent No.: US 8,694,878 B2
(45) Date of Patent: Apr. 8, 2014

(54) PROCESSOR INSTRUCTIONS TO ACCELERATE VITERBI DECODING

(75) Inventors: Prohor Chowdhury, Bangalore (IN); Alexander Tessarolo, Lindfield (AU)

(73) Assignee: Texas Instruments Incorporated, Dallas, TX (US)

( * ) Notice: Subject to any disclaimer, the term of this patent is extended or adjusted under 35 U.S.C. 154(b) by 99 days.

(21) Appl. No.: 13/517,579

(22) Filed: Jun. 13, 2012

(65) Prior Publication Data

US 2012/0324318 A1    Dec. 20, 2012

Related U.S. Application Data

(60) Provisional application No. 61/497,467, filed on Jun. 15, 2011.

(51) Int. Cl.
*H03M 13/03*    (2006.01)

(52) U.S. Cl.
USPC .......................................................... 714/795

(58) Field of Classification Search
None
See application file for complete search history.

(56) References Cited

U.S. PATENT DOCUMENTS

| | | | | |
|---|---|---|---|---|
| 5,748,650 | A * | 5/1998 | Blaker et al. ................... | 714/786 |
| 8,201,064 | B2 * | 6/2012 | Ferguson ........................ | 714/795 |
| 2003/0028844 | A1 * | 2/2003 | Coombs ........................ | 714/796 |
| 2004/0052318 | A1 * | 3/2004 | Traeber .......................... | 375/341 |
| 2004/0225949 | A1 * | 11/2004 | Coombs et al. ................ | 714/796 |
| 2005/0060632 | A1 * | 3/2005 | Honary et al. ................. | 714/795 |
| 2005/0157823 | A1 * | 7/2005 | Sudhakar ....................... | 375/341 |
| 2010/0002793 | A1 * | 1/2010 | Dent et al. ..................... | 375/265 |
| 2010/0299583 | A1 * | 11/2010 | Young ............................ | 714/795 |
| 2012/0117441 | A1 * | 5/2012 | Hansen et al. ................. | 714/752 |

OTHER PUBLICATIONS

"Concerto F28M35x", Literature No. SPRUH22B, Technical Reference Manual, Texas Instruments Incorporated, Nov. 2011, Revised Dec. 2011, pp. 1-1746.
"Viterbi decoder", Wikipedia, pp. 1-6, available at http://en.wikipedia.org/wiki/Viterbi_decoder on Jun. 12, 2012.

\* cited by examiner

*Primary Examiner* — Daniel McMahon
(74) *Attorney, Agent, or Firm* — John R. Pessetto; Wade J. Brady, III; Frederick J. Telecky, Jr.

(57) ABSTRACT

Viterbi decoding is performed on a microcontroller by initializing a state-metric array by executing load instructions to load state-metric data from a memory module into a set of registers in the microcontroller. Butterfly processing on the state-metric array is performed by executing Viterbi processing instructions fetched from a program storage module to manipulate the state-metric (SM) data in the set of registers for each Viterbi butterfly in a stage of Viterbi decoding to form a final set of state-metric data and trace bits. After completing each stage, a final set of state-metric data is stored in the memory module by executing store instructions.

16 Claims, 9 Drawing Sheets

PROCESSOR INSTRUCTIONS TO ACCELERATE VITERBI DECODING

CLAIM OF PRIORITY UNDER 35 U.S.C. 119(e)

The present application claims priority to and incorporates by reference U.S. Provisional Application No. 61/497,467, filed Jun. 15, 2011, entitled "High Performance Decoding System".

FIELD OF THE INVENTION

This invention generally relates to microprocessors, and in particular to special instructions for a microprocessor to accelerate Viterbi decoding.

BACKGROUND OF THE INVENTION

Convolution encoding at the transmitter (Tx) side and Viterbi Decoding at the receiver (Rx) side is a very commonly used technique for reliable data communication in many applications such as radio, mobile communication, satellite communication etc. Performing Viterbi decoding in software demands very high instruction processing rates from the processor. Hardware support for fast Viterbi decoding is often found in Digital Signal Processors (DSPs).

The Viterbi algorithm is a dynamic programming algorithm for finding the most likely sequence of hidden states, called the Viterbi path, that results in a sequence of observed events, especially in the context of Markov information sources and hidden Markov models.

The Viterbi algorithm was proposed by Andrew Viterbi in 1967 as a decoding algorithm for convolutional codes over noisy digital communication links. The algorithm has found universal application in decoding the convolutional codes used in both CDMA and GSM digital cellular, dial-up modems, satellite, deep-space communications, and 802.11 wireless LANs. It is now also commonly used in speech recognition, keyword spotting, computational linguistics, and bioinformatics.

Viterbi decoding may be done by executing a software program on a processor using the general instruction set of the processor. Since the decoding process is computationally intense, this may take a significant amount of instruction processing on the processor.

Dedicated Viterbi decoders may be used for Viterbi decoding. Typically, once configured by a processor, the dedicated Viterbi decoder performs the complete Viterbi decoding and provides an indication to the processor, such as interrupt, at the end of the decoding process. These solutions are hardware intensive in terms of gate count and area.

BRIEF DESCRIPTION OF THE DRAWINGS

Particular embodiments in accordance with the invention will now be described, by way of example only, and with reference to the accompanying drawings.

Figure 1:
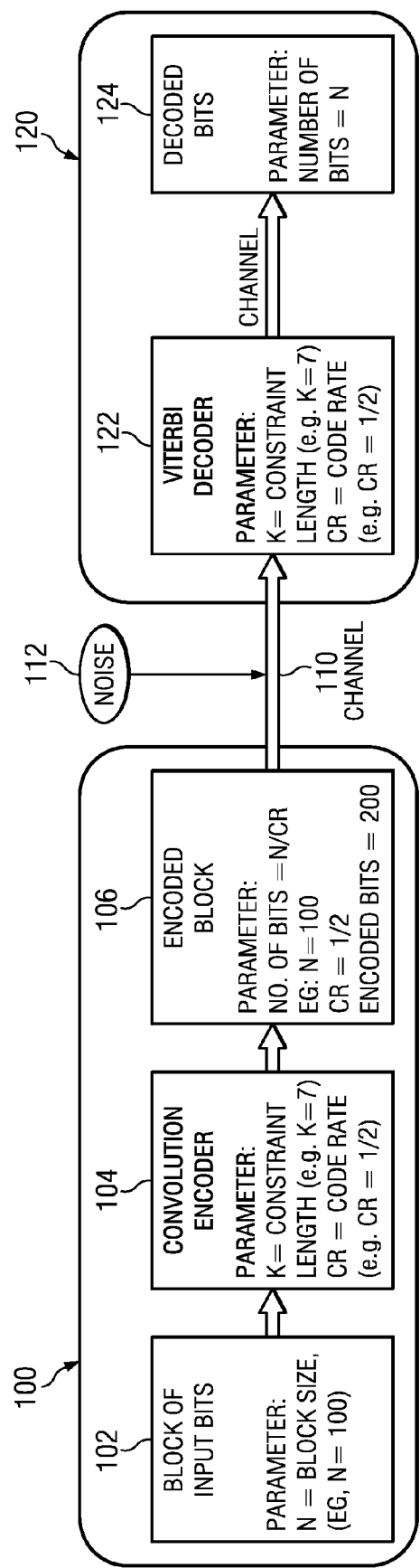
FIG. 1 illustrates a general flow of data communication using convolution encoding and Viterbi decoding.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Digital processors, typically microcontrollers (MCUs), targeted for cost sensitive embedded applications operate at much lower frequencies (MHz) than general purpose DSPs or Microcontrollers to keep the cost and power consumption of the chip to an absolute minimum. Due to their lower operating frequencies, meeting an instruction processing (MIPS—millions of instructions per second) requirement in an application where Viterbi decoding is essential (e.g. power line communication) becomes a challenge. A pure software approach of Viterbi decoder leaves very little room for these low cost processors to perform other required tasks because Viterbi decoding is very compute intensive. For low cost systems, the use of a dedicated hardware Viterbi decoder module may be too expensive in terms of gate count and/or power dissipation, for example. While Viterbi decoding may be done by executing a software program on a processor using the standard instruction set of the processor, this may require the processor to be operated at a higher instruction processing rate than desired, which increases power dissipation. An embodiment of the invention may provide specialized Viterbi decoding instructions that may be executed by a processor or by a coprocessor coupled to the processor to accelerate Viterbi decoding. In this manner, Viterbi decoding may be performed by executing a software program using the specialized Viterbi decoding instructions without requiring the processor to be operated at an elevated instruction processing rate. In an embodiment that will be described in more detail below, Viterbi decoding may be performed approximately six times faster by a processor that is using a set of Viterbi instructions as compared to the same processor using only its standard set of instructions to perform Viterbi decoding.

FIG. 1 illustrates a general flow of data communication using convolution encoding and Viterbi decoding, which may be implemented using a set of specialized Viterbi decoding instructions that will be described in more detail below. Convolution encoding at the transmitter (Tx) 100 side and Viterbi Decoding at the receiver (Rx) 120 side is a very commonly used technique for reliable data communication in many applications such as radio, mobile communication, satellite communication etc.

For convolution encoding at transmitter 100, a block of input data 102 is selected from a stream of data. For example, the block of data may be 100 bits. The block size is represented by N, where in this example N=100 bits. Convolution encoding 104 is performed on each block of data using known convolution techniques. Typically, a constraint length (K) is selected. In this example K=7. A code rate (CR) is also selected. The code rate is the ratio by which the initial block size is increased to provide data redundancy, which is later exploited during Viterbi decoding to overcome the effects of noise. CR is typically ½, meaning twice as many bits are transmitted for a given data block, or ⅓, meaning three times as many bits are transmitted for a given data block. The convolution encoding 104 produces an encoded block 106 of data that contains N/CR bits. For example, for N=100 bits and CR=½, the encoded block will contain 200 bits.

The encoded block is then transmitted over a communication channel 110, using known modulation techniques. The communication channel may be wireless media using radio frequencies, infrared or optical signals, or wired media using metallic or optic cables, for example. Whatever the media, noise 112 may interfere with the transmitted signal and corrupt the signal.

At receiver 120, Viterbi decoding 122 is performed on each received encoded block of data 106, based on the encoding parameters K and CR. This operation produces a decoded block of bits 124 that should reproduce the original block of data bits 102.

The most compute intensive part of Viterbi decoding is an operation called "Viterbi-butterfly". For every decoder input symbol corresponding to a single bit at the encoder end, this operation needs to be performed $2^{(K-1)}/2$ number of times. This operation needs to be performed for every decoder input symbol and hence takes the bulk of the processing time. At the end of all the butterfly operations, a two dimensional table called the "state transition matrix" table gets populated. This matrix is an array of $2^{(K-1)}$ rows and N+K−1 columns. An operation called the Viterbi traceback traverses over the state transition matrix (from the last column to the first column) to generate the decoded output bits.

Present microcontrollers (MCUs) intended for low cost/low power embedded applications are not suitable for Viterbi decoding related applications. Typically, in these types of applications, operating frequencies are significantly lower than used for high performance DSPs (MHz vs GHz). Also, to keep system cost low, dedicated Viterbi decoding accelerator blocks are typically not included with an MCU in an embedded application.

Viterbi decoding support has become an important need for MCUs. This is because MCUs are being used in communication, particularly for power line communication (PLC) and wireless communication in smart meters, referred to as e-meters. E-meter applications require low cost, low power consumption, high analog module integration etc. A set of specialized Viterbi instructions that may be executed by an MCU to accelerate Viterbi-butterfly operations will be described in more detail below.

Figure 2:
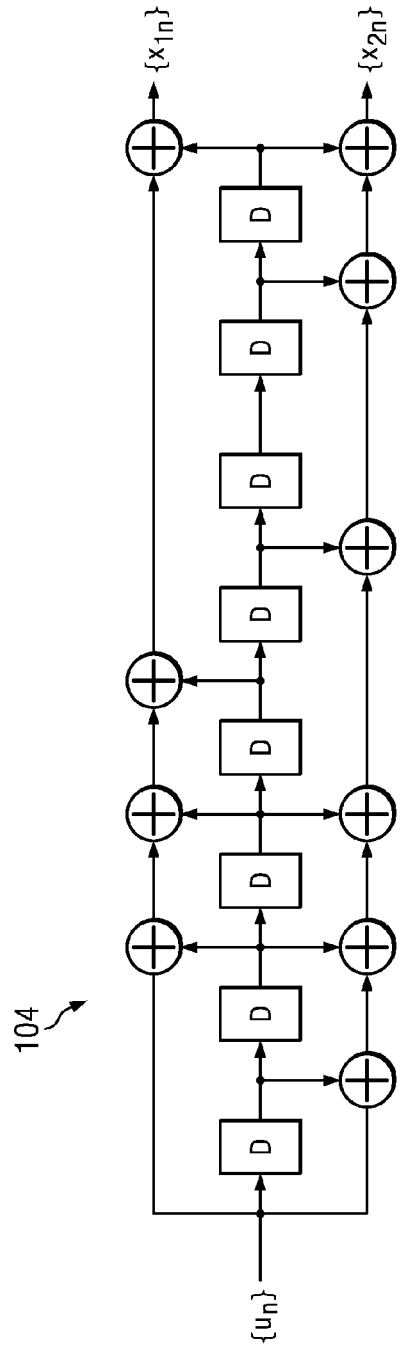
FIG. 2 illustrates convolution encoding.

The general operation of Viterbi decoding will now be described in order to better appreciate the operation of the set of Viterbi instructions. FIG. 2 illustrates in more detail convolutional encoder 104 that implements a code rate of ½. Convolutional encoder 104 can be thought of as a delay line with (K−1) elements. Parameter K is referred to as the constraint length. Input to the delay line is a binary information sequence $\{un\}$ of length N, such as data block 102 in FIG. 1. The sequence is shifted through a delay line, one bit at a time. For each input bit un, there are R=1/CR output bits x1n, x2n, . . . , xRn. Parameter CR is referred to as the code rate. The output is formed by adding (modulo 2) outputs of delay line elements, according to binary polynomials G1={g11, g12, . . . , g1K}; G2={g21, g22, . . . , g2K}; . . . , GR={gR1, gR2, . . . , gRK}. The polynomials are usually specified in octal notation. For example, FIG. 2 shows a K=9, CR=½ convolutional encoder with polynomials G1G2={561,753}, which may also be written as G1={1,0,1,1,1,0,0,0,1} and G2={1,1,1,1,0,1,0,1,1}.

To facilitate the decoding process, the initial state of delay elements is the all-zero state. In addition, by appending (K−1) zeros (tail bits) at the end of the N-bit input sequence, it is also ensured that the final state is the all-zero state.

The Viterbi algorithm is an efficient implementation of a maximum likelihood sequence detector. It produces the most likely transmitted sequence {un,est}, given a received noisy sequence {yn}. Throughout this document, it is assumed that values {yn} represent real, quantized analog values. These are referred to as input symbols.

Figure 3:
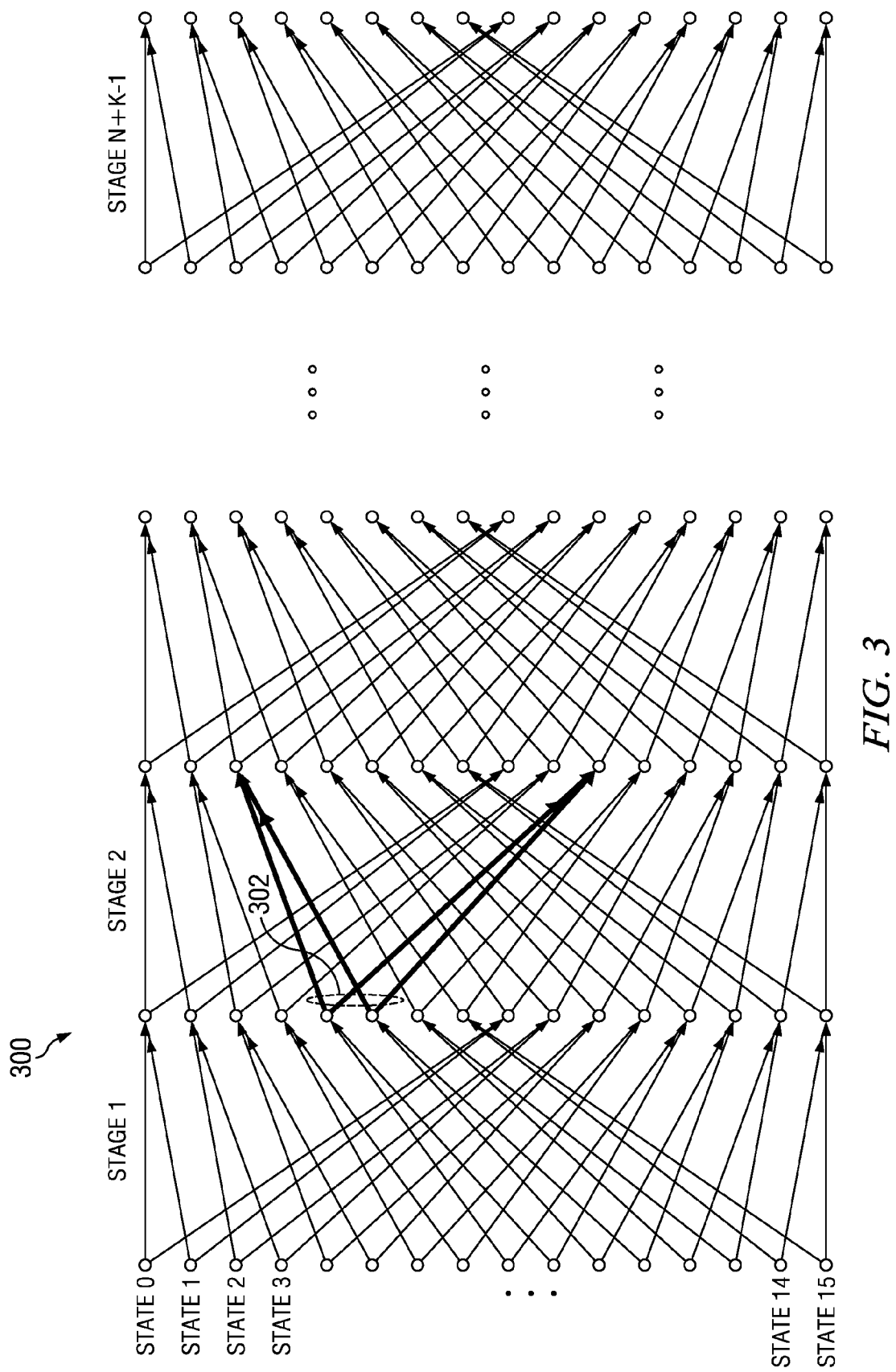
FIG. 3 illustrates a trellis used for Viterbi decoding.

In its application to decoding of convolutional codes, the received sequence {yn} is the noisy version of the encoded sequence {xn}, and the algorithm estimates the most likely sequence at the input to the convolutional encoder {un}. The most likely sequence is found by traversing, in forward and backward directions, a trellis whose structure is determined by the convolutional code parameters. An example of a trellis 300 for K=5 is shown in FIG. 3.

The trellis consists of nodes (states) that are connected by branches. The total number of stages in the trellis, for a terminated frame, is (N+K−1), i.e., it represents the length N of the input data sequence, followed by (K−1) tail bits. At each stage, there are $2^{(K-1)}$ states. The state is the decimal representation of the contents of the encoder's memory elements. Two branches are originated in each state (corresponding to binary inputs un=0 and un=1), and two branches are terminated in each state. Each branch is labeled with 1-bit input label ("0" or "1"), and CR-bit output label. For example, on the branch connecting state 1 to state 0, the input label is i=0, indicating the bit that is shifted into the left-most delay element, and the output label is, for the encoder shown in FIG. 1, i=11, indicating bits which are produced at the output of the encoder when bit 0 is present at the input, and encoder state is 1.

The entire trellis can be constructed from Viterbi butterflies, a structure consisting of two states at stage n, connected by two branches each to two states at stage n+1. One such butterfly is highlighted in FIG. 3 at 302.

Branch Metrics

Associated with each branch in the trellis is a branch metric. The branch metric is a measure of how "close" the received noisy values yn={y1n, y2n, . . . , yRn} are to the output branch label o={o1, o2, . . . , oR}.

For a rate r=1/CR code, 2CR different branch output labels "o" are possible. Therefore, for each stage n, 2CR branch metrics need to be computed.

Branch metric bo is computed as a Euclidean distance between the received noisy sample and branch label. This expression can be simplified as shown in equation (1).

$$bon = y1n(-1)o1 + y2n(-1)o2 + \ldots + yRn(-1)oR \quad (1)$$

Due to symmetry, b00n=−b11n, and b01n=−b10n. It therefore suffices to compute 2CR−1 branch metrics for each trellis stage n.

State Metrics, Path Metrics, and Transition Bit

Figure 4:
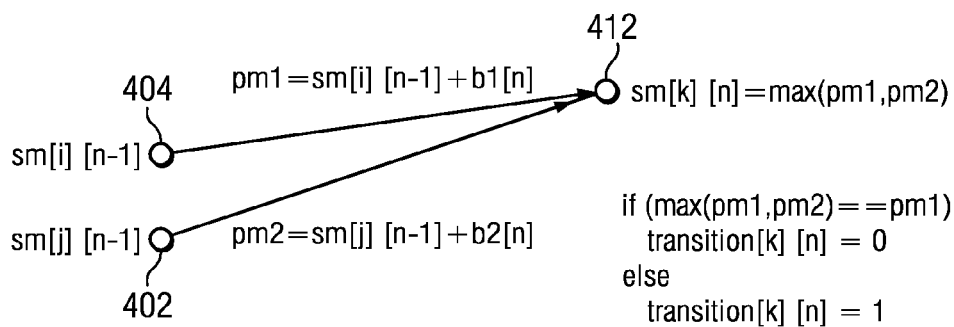
FIG. 4 illustrates state metric accumulation.

The trellis is traversed in the forward direction in order to accumulate branch metrics (sm) along paths through the trellis. The Viterbi algorithm is based on the fact that it is sufficient to accumulate state metrics sm[k], k=0, . . . , 2K−1−1. As discussed above, two branches (corresponding to two paths) merge in each state. At each state, the path with the larger accumulated metric is chosen as the survivor and the other path is discarded. The path metric (pm) associated with the survivor path becomes state metric for the state and stage in which the two paths have merged. The process of accumulating path metrics for two states 402, 404 and selecting the survivor for state 412 is graphically represented in FIG. 4.

It is necessary to "remember" the input label of the branch belonging to the survivor path. This information is referred to as transition bit and is denoted as transition[k][n] in FIG. 3. Therefore, one transition bit per state per stage needs to be saved for the next step in the algorithm.

At stage 0, state metrics need to be initialized. One of the choices is to initialize them all to zero. However, in order to take advantage of the fact that the initial state is zero, the state 0 can be "favored" by giving it a higher initial metric than the remaining states. For example, state zero could be initialized to 0 and remaining states to the smallest negative number.

Traceback

Figure 5:
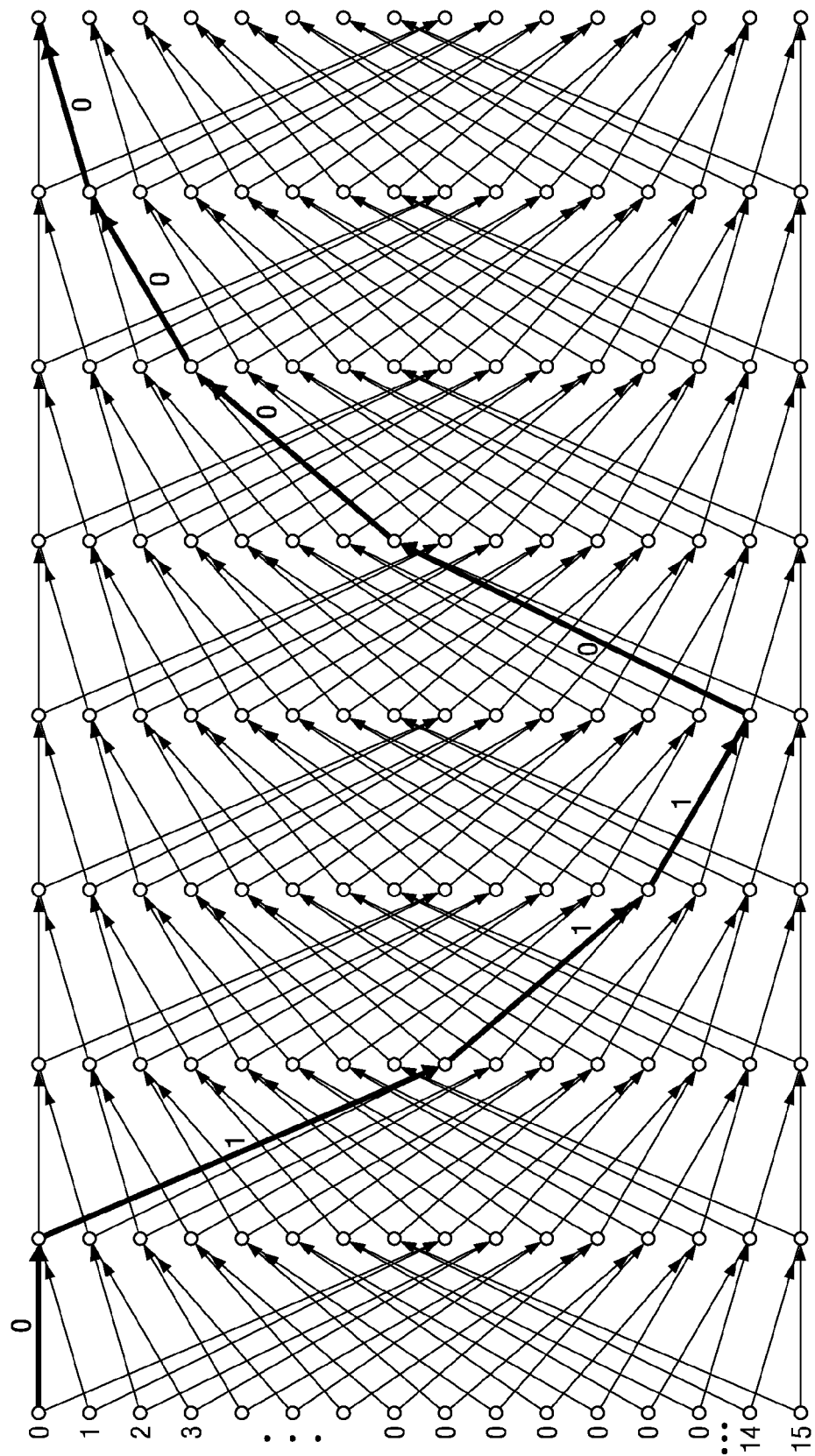
FIG. 5 illustrates trace back operation.

FIG. 5 illustrates trace back operation for a simple example of N=4, K=5. At the start of the traceback, the fact that the encoder terminates in state zero may be exploited. The traceback therefore starts from state 0 at the last trellis stage, i.e., stage (N+K−2).

The transition bits saved during state metric accumulation process are next exploited. The transition bit associated with state 0 at stage (N+K−2), denoted transition[0][N+K−2], gives information on the origin for the path which terminated in state 0 at stage (N+K−2). If the transition bit is 0, the origin is state 0 at stage (N+K−2), otherwise the origin is state 1.

By following the transition bits while traversing the trellis in the backward direction, the overall survivor path that corresponds to a particular input sequence is effectively chosen. The sequence of input labels of branches along the survivor path is the decoded maximum likely sequence. In FIG. 5, the decoded sequence is uest={0,1,1,1}. The last four zeros in the path are tail bits and are not part of the information frame.

Figure 6:
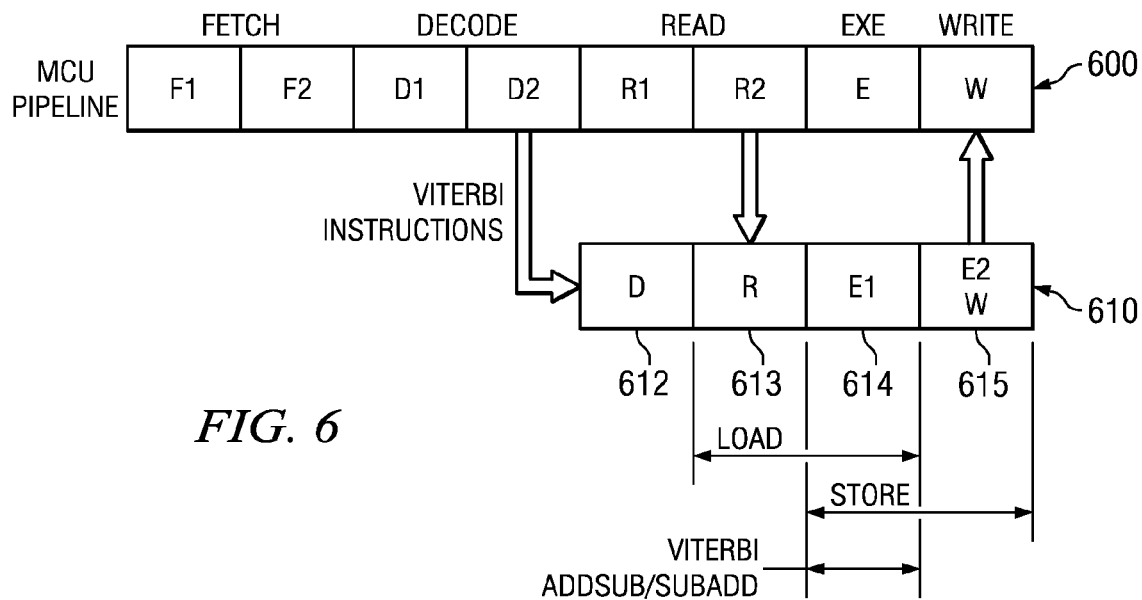
FIG. 6 illustrates an instruction execution pipeline of an exemplary microcontroller that includes Viterbi instructions.

FIG. 6 illustrates an instruction execution pipeline 600 of an exemplary microcontroller that includes a set of Viterbi instructions. MCUs typically have simple instruction execution pipeline in order to minimize cost and power dissipation. Instruction pipeline 600 can handle instructions that have the following characteristics:

A single Instruction can perform a memory-read or a memory-write but not both

A single instruction can perform a memory-read or a memory-write. In parallel with this memory operation, it can also perform an internal operation with no additional memory access requirement. (e.g. ADD/SUB/COMPARE involving internal registers)

A single instruction can perform an internal operation without any memory access In this particular example, an instruction is fetched from an instruction memory that is coupled to the MCU processor during pipeline stage F1. A second pipeline stage F2 completes the instruction fetch timing. The instruction is then decoded during two pipeline stages D1 and D2. Depending on the instruction, a memory read may be performed during pipeline stages R1, R2, an internal operation may be performed during execution stage E, and a memory write may occur during write stage W.

When a Viterbi instruction is detected, an addition pipeline decode stage 612 may be incurred to complete the instruction decoding. A memory read operation may occur during read stage 613 and execution stage 614. An internal operation may occur during execution stages 614, 615. A memory write operation may occur during execution stage 614 and write stage 615.

Figure 7:
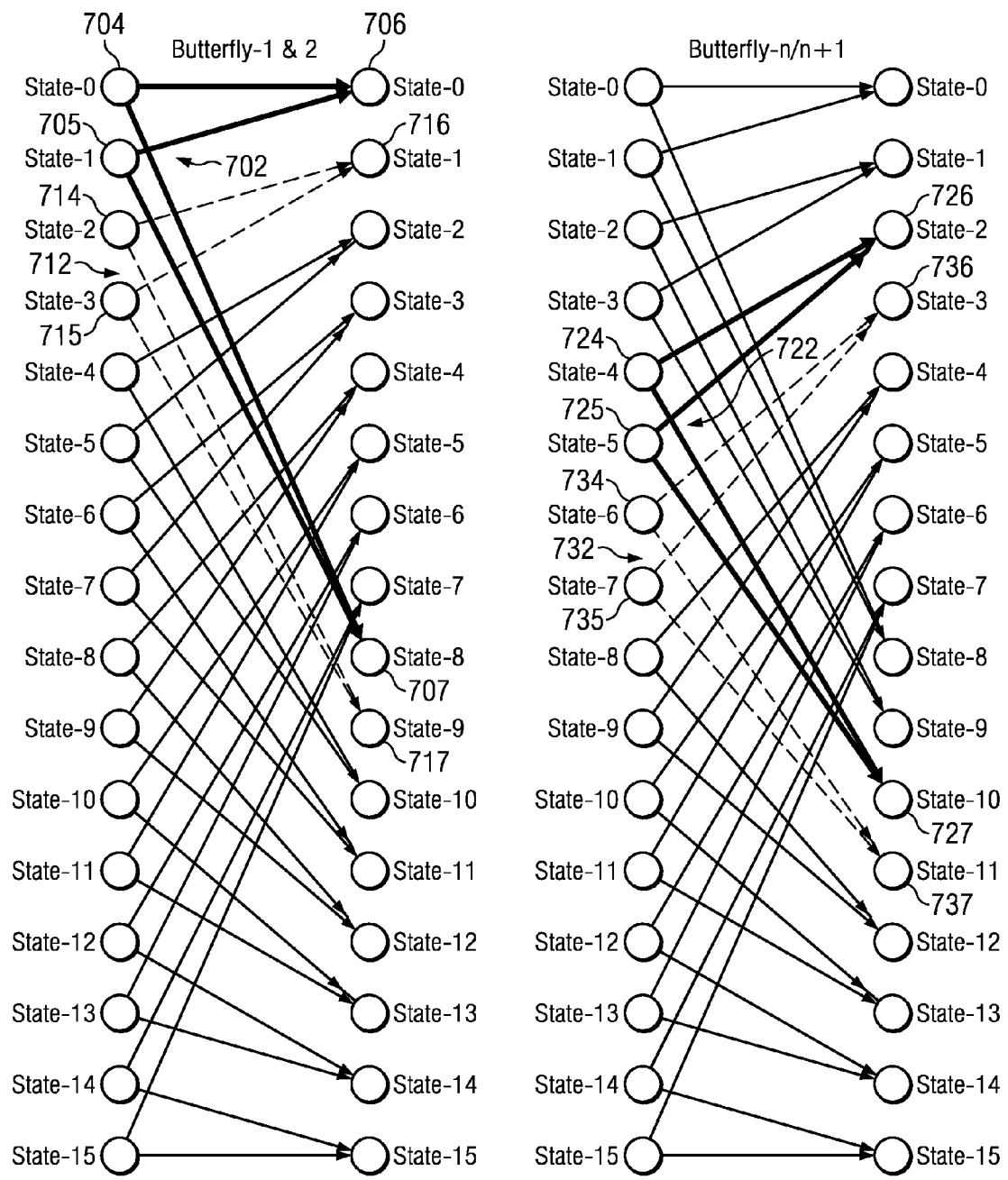
FIGS. 7-9 illustrate Viterbi butterfly operation using a set of Viterbi instructions.
Figure 8:
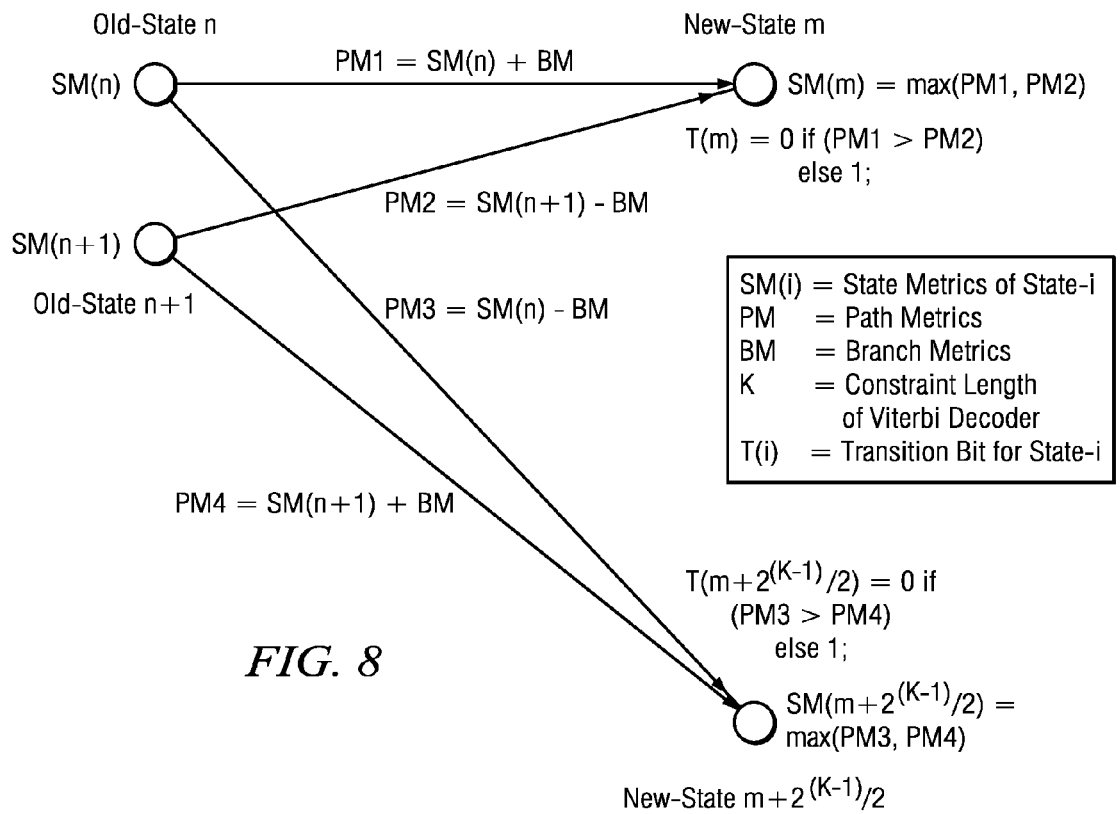
Figure 9:
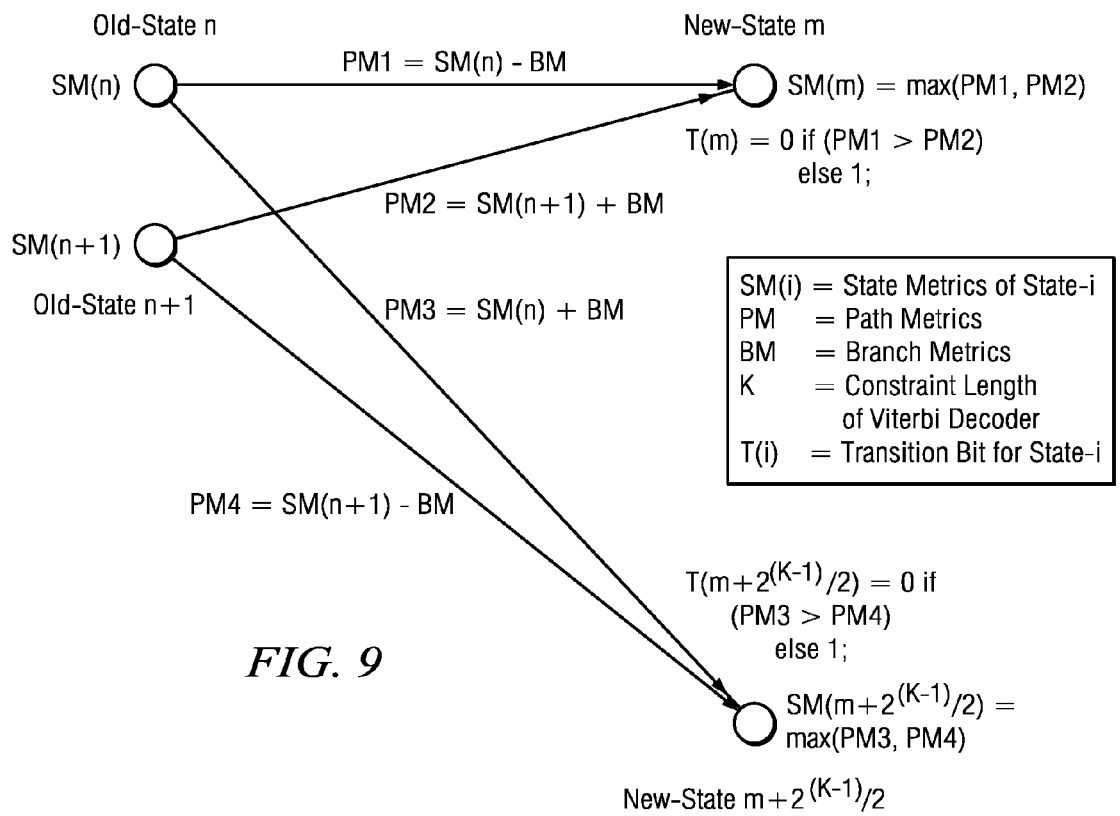

FIGS. 7-9 illustrate Viterbi butterfly operation using a set of Viterbi instructions. The set of Viterbi instructions maximize the utilization of each Instruction entering the pipeline, thereby reducing the overall cycle-count required to execute a butterfly operation. In this embodiment, a short sequence of Viterbi instructions process pairs of butterfly operations. Two such pairs are highlighted in the diagram of FIG. 7 for K=5. A first pair includes butterfly 702 that originates from states 704, 705 and terminates in states 706, 707 and butterfly 712 that originates from states 714, 715 and terminates in states 716, 717. A second pair includes butterfly 722 that originates from states 724, 725 and terminates in states 726, 727 and butterfly 732 that originates from states 734, 735 and terminates in states 736, 737.

While the description herein is for a 32-bit MCU, other embodiments are not limited to 32-bit MCUs. For example, another embodiment may be on a 16-bit MCU. The description below assumes a 32-bit MCU which can perform 32-bit memory read/write operations, with CPU internal registers that are 32-bit.

The most compute intensive part of Viterbi decoding is an operation called "Viterbi-butterfly". For every decoder input symbol (corresponding to a single bit at the encoder end), this operation needs to be performed $2^{(K-1)}/2$ number of times. This operation needs to be performed for every decoder input symbol and hence takes the bulk of the processing time. At the end of all the butterfly operations, a two dimensional table called the "state transition matrix" table gets populated. This matrix is an array of $2^{(K-1)}$ rows and N+K−1 columns. An operation called the Viterbi traceback traverses over the state transition matrix (from the last column to the first column) to generate the decoded output bits. The Viterbi butterfly operations are of two types as shown in FIGS. 8 and 9, where FIG. 8 illustrates a type 1 Viterbi butterfly and FIG. 9 illustrates a type 2 Viterbi butterfly. All the state-metrics are stored in a state metrics array. Each state-metric is encoded into 16-bits.

The state-metrics-array is initialized in the beginning of the algorithm as per Viterbi decoding theory.

The two types of butterfly operation differ only in the way the Path Metrics (PMs) are calculated. The inputs to this operation are state metrics (SM) of two consecutive old states in the Viterbi Trellis diagram and an applicable Branch Metrics (BM). The BMs are a function of the bits of encoded symbol corresponding to a single input bit to the convolution encoder. There are a total of $2^{1/CR}/2$ number of BMs for a Viterbi decoder which needs to be computed and stored beforehand. For example:

For CR=½, there are a total of 2 BMs

For CR=⅓, there are a total of 4 BMs.

For each butterfly operation, the applicable BM depends upon the polynomial of the convolution encoder. The butterfly operation involves:

Calculating four Path Metrics (PM) as shown in the FIGS. 8 and 9

Calculating the State Metrics (SM) of two new states as shown in the FIGS. 8 and 9

Calculating the Transition bit (T) for the two new states as shown in the FIGS. 8 and 9.

In one embodiment, a set of five Viterbi instructions are added to an MCU processor. This set of five instructions provides a significant performance boost to the performance of the overall Viterbi decoding algorithm. These instructions will now be described. A register naming convection used in this section is as follows:

Rx: Represents a general purpose 32-bit processor register (e.g. R0, R1)

RxL: Lower 16-bits of a general purpose register (e.g. R0L, R1L)

RxH: Upper 16-bits of a general purpose register (e.g. R0H, R1H)

A Viterbi path metric (VITPM) instruction is defined to operate as shown in Table 1.

TABLE 1

Viterbi path metric (VITPM) instruction

| | |
|---|---|
| Inputs | Register which holds the SMs of two consecutive Old States involved in the butterfly operation<br>Register which holds the applicable BM for that butterfly operation<br>Operation_Type: to indicate whether to perform type-1 or type-2 Path Metrics (PM) calculations |
| Operation | This instruction will perform four parallel PM calculation (as per the butterfly type) and update these results in lower and upper half of two 32-bit registers in a single-cycle (done in the Execute phase of the processor pipeline) |
| Example 1-a | VITPM TYPE1, R4, R3, R2, R0H<br>Explanation:<br>The BM is initialized in R0H<br>State Metrics of two old states are initialized in lower and upper half of R2<br>R3L = R2L + R0H (PM1 Calculation)<br>R3H = R2H − R0H (PM2 Calculation)<br>R4L = R2L − R0H1 (PM3 Calculation)<br>R4H = R2H + R0H (PM4 Calculation) |
| Example 1-b | VITPM TYPE2, R4, R3, R2, R1L<br>Explanation:<br>The BM is initialized in R1L<br>State Metrics of two old states are initialized in lower and upper half of R2<br>R3L = R2L − R1L (PM1 Calculation)<br>R3H = R2H + R1L (PM2 Calculation)<br>R4L = R2L + R1L (PM3 Calculation)<br>R4H = R2H − R1L (PM4 Calculation) |

A Viterbi path metric instruction that operates in parallel with a store operation (VITPM||STORE) is defined to operate as shown in Table 2.

TABLE 2

VITPM || STORE instruction

| | |
|---|---|
| Inputs | Same as the VITPM instruction<br>Register which holds SM of two consecutive new states in its lower and upper half<br>Address Register (AR) which holds the address of the memory location where SMs of the new states need to be stored |
| Operation | This instruction performs exactly similar to the VITPM instruction<br>Additionally, this instruction saves the SM of the new state at the address location pointed by the address-register (typically done in the write phase of the processor pipeline)<br>The address-registers content is incremented for the next operation |
| Example 2 | VITPM TYPE1, R4, R3, R2, R0H || MOV32 *AR2++, R5<br>Explanation: In addition to the VITPM operation, this instruction additionally does the following<br>[AR2] = R5L<br>[AR2 + 1] = R5H<br>AR2 = AR2 + 2 |

A Viterbi state-metric selection (VITSEL) instruction is defined to operate as shown in Table 3.

TABLE 3

VTSEL instruction

| | |
|---|---|
| Inputs | Two register which hold four PMs in their lower and upper half<br>Update_Directive: Can be LOWER or UPPER. This tells whether the computed SM for the new states will get updated lower or upper half of the destination registers<br>Two destination Transition-bit registers: These are two 32-bit registers which store the generated T bit for the lower and upper new state (refer to the diagram) |
| Operation | Compares the PMs (as describes in FIG. 1 and 2) and generates State Metrics (SM) and Transition bit (T) for two new states<br>Depending upon the Update_Directive, stores the generated SMs into lower or upper half of two destination registers<br>Previous content of the two Transition-bit registers are left shifted and the T bit of the lower and upper new state are updated in the LSB of the respective Transition-bit register |
| Example 3-a | VITSEL LOWER, T1, T0, R6, R5, R4, R3<br>Explanation: The PMs are initialized in lower and upper half of R3 and R4 register (done by the VITPM instruction)<br>R5L = max(R4L, R4H) (SM of lower new state)<br>R6L = max(R5L, R5H) (SM of upper new state)<br>T0 = T0 << 1<br>T1 = T1 << 1<br>T0[0:0] = 0 if (R4L > R4H) else 1; (T bit of lower new state)<br>T1[0:0] = 0 if (R5L > R5H) else 1; (T bit of upper new state) |
| Example 3-b | VITSEL UPPER, T3, T2, R8, R7, R4, R3<br>Explanation: The PMs are initialized in lower and upper half of R3 and R4 register (done by the VITPM instruction)<br>R7H = max(R4L, R4H) (SM of lower new state)<br>R8H = max(R5L, R5H) (SM of upper new state)<br>T2 = T2 << 1<br>T3 = T3 << 1<br>T2[0:0] = 0 if (R7L > R7H) else 1; (T bit of lower new state)<br>T3[0:0] = 0 if (R8L > R8H) else 1; (T bit of upper new state) |

A VITSEL instruction that operates in parallel with a load operation (VITSEL||LOAD) is defined to operate as shown in Table 4.

TABLE 4

VITSEL || LOAD Instruction

| | |
|---|---|
| Inputs | Same as VITSEL instruction<br>Address Register (AR) which holds the address of the memory location where the SMs of the old states are stored |
| Operation | This instruction performs exactly similar to the VITSEL instruction<br>Additionally, this instruction loads the SM of the old states for the next butterfly operation from the address location pointed by the address-register<br>The address-registers content is incremented for the next operation |
| Example 4 | VITSEL LOWER, T1, T0, R6, R5, R4, R3 || MOV32 R2, *XAR1++<br>Explanation: In addition to the VITSEL operation, this instruction additionally does the following:<br>R2L = [AR1] (SM of lower old state for the next butterfly operation)<br>R2H = [AR1 + 1] (SM of upper old state for the next butterfly operation)<br>AR1 = AR1 + 2 |

A Viterbi trace (VITTRACE) instruction is defined to operate as shown in Table 5.

TABLE 5

VITTRACE instruction

| | |
|---|---|
| Inputs | The set of Transition-bit Registers loaded with the T bits of all the states belonging to a particular Viterbi stage. The T bit of each state should hold a pre-defined bit position in one of these Transition-bit registers. |

TABLE 5-continued

VITTRACE instruction

| | |
|---|---|
| Operation | Register which holds the State number of the current state (during a traceback operation) on a particular Viterbi stage This instruction understands the predefined position of the T bit for each state within the Transition-bit Registers. Depending upon the value of the current state number Also, this instruction updates the register which holds the current state to the destination state of the previous stage (as required by the traceback operation). This calculation is as per the following formula:<br>Next State (previous state) = mod$_{(K-1)}$(2 * Current_state + Current_T_bit) |
| Example 5 | VITTRACE *AR5++, R0, T1, T0 (for K = 7)<br>Explanation:<br>R0: Holds the current state during the traceback<br>T1 and T0 and loaded with the T bits of 64 states<br>T bits for state 0 to 31 are stored in T0 from MSB to LSB<br>T bits for state 32 to 63 are stored in T1 from MSB to LSB<br>S = R0[5:0]<br>if (S < 32)<br>temp[0] = T0[31−S]<br>else<br>temp[0] = T1[63−S] |

Figure 10:
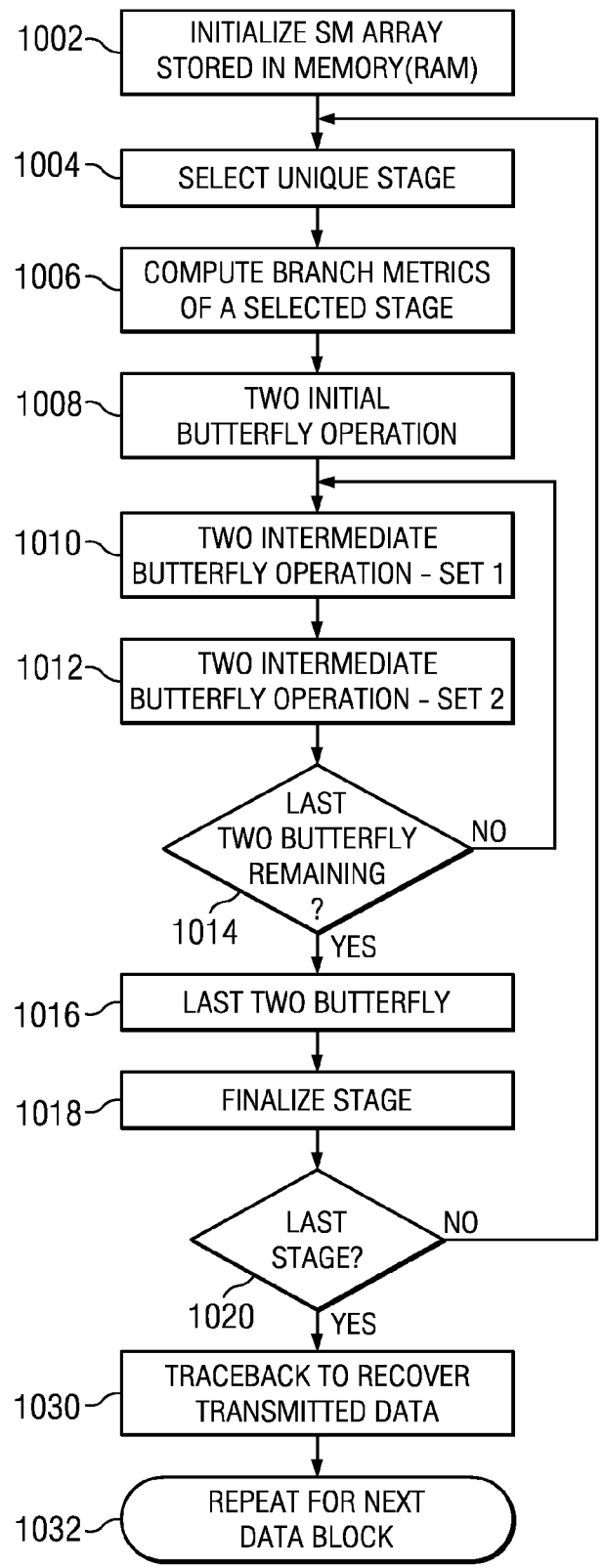
FIG. 10 is a flow chart of Viterbi decoding using Viterbi instructions.

FIG. 10 is a flow chart of Viterbi decoding using the set of Viterbi instructions described above. This example is for K=5, therefore there are sixteen states in each stage and eight pairs of butterflies to be calculated for each stage.

The state metrics (SM) of all the old states are stored 1002 sequentially in an array of 16-bit signed numbers (called the old-state-metrics array). One stage is selected 1004 for a set of butterfly operations.

Since the old-states in a butterfly operation are always consecutive, a single 32-bit read can be performed to load SMs of the two old states involved in the Viterbi butterfly operation into a 32-bit processor register. Most processors will have an instruction already available for performing 32-bit read operations.

The BM calculation 1006 happens once per Viterbi stage (comprising of $2^{(K-1)}/2$ butterfly operations) and hence is not very compute intensive. The BM can be calculated using already available processor instructions and initialized to internal registers.

Two initial butterfly operations are performed 1008. For butterfly 1, a VITPM instruction is used to compute four path metrics, followed by a VITSEL||LOAD instruction to compute two new SMs and updates the lower half of REG1 and REG2. A corresponding T-bit in the trace register is also updated. In parallel, load two next SMs (VITSEL_TYPE1 REG1, REG2||LOAD). For butterfly 2, a VITPM instruction is used to compute four path metrics, followed by a VITSEL||LOAD instruction to compute two new SMs, and update the upper half of REG1 and REG2. A corresponding T-bit in the trace register is also updated. In parallel, load two next SMs (VITSEL_TYPE2 REG1, REG2||LOAD)

Two intermediate butterfly operations are performed 1010. For butterfly 3, a VITPM||STORE instruction is used to compute four path metrics and in parallel store two consecutive new SMs present in REG1 to memory (VITPM||STORE REG1), followed by a VITSEL||LOAD instruction to compute two new SMs, and update the lower half of REG3 and REG4. A corresponding T-bit in the trace register is also updated. In parallel, load two next SMs (VITSEL_TYPE1 REG3, REG4||LOAD). For butterfly 4, a VITPM||STORE instruction is used to compute four path metrics and in parallel store two consecutive new SMs present in REG2 to memory (VITPM||STORE REG2), followed by a VITSEL||LOAD instruction to compute two new SMs, and update the upper half of REG3 and REG4. A corresponding T-bit in the trace register is also updated. In parallel, load two next SMs (VITSEL_TYPE2 REG3, REG4||LOAD).

Two more intermediate butterfly operations are performed 1012. For butterfly 5, a VITPM||STORE instruction is used to compute four path metrics and in parallel store two consecutive new SMs present in REG3 to memory (VITPM||STORE REG3), followed by a VITSEL||LOAD instruction to compute two new SMs, and update the lower half of REG1 and REG2. A corresponding T-bit in the trace register is also updated. In parallel, load two next SMs (VITSEL_TYPE1 REG1, REG2||LOAD). For butterfly 6, a VITPM||STORE instruction is used to compute four path metrics and in parallel store two consecutive new SMs present in REG4 to memory(VITPM||STORE REG4), followed by a VITSEL||LOAD instruction to compute two new SMs, and update the upper half of REG1 and REG2. A corresponding T-bit in the trace register is also updated. In parallel, load two next SMs (VITSEL_TYPE2 REG1, REG2||LOAD).

A check is made 1014 to determine if there are only two remaining butterflies in this stage. If not, steps 1010 and 1012 are repeatedly performed. In this example of K=5, there are only eight butterflies per stage.

The last two butterfly operation for this stage are performed 1016. For butterfly 7, a VITPM||STORE instruction is used to compute four path metrics and in parallel store two consecutive new SMs present in REG1 to memory (VITPM||STORE REG1), followed by a VITSEL||LOAD instruction to compute two new SMs, and update the lower half of REG3 and REG4. A corresponding T-bit in the trace register is also updated. In parallel, load two next SMs (VITSEL_TYPE1 REG3, REG4||LOAD). For butterfly 8, a VITPM||STORE instruction is used to compute four path metrics and in parallel store two consecutive new SMs present in REG2 to memory (VITPM||STORE REG2), followed by a VITSEL||LOAD instruction to compute two new SMs, and update the upper half of REG3 and REG4. A corresponding T-bit in the trace register is also updated. In parallel, load two next SMs (VITSEL_TYPE2 REG3, REG4||LOAD).

At the completion of a stage, the computations are finalized 1018 by storing the SMs of the last two butterflies into memory, and then storing the contents of the trace registers into memory.

The Viterbi decoding process then continues by selecting 1004 the next stage and repeating the butterfly calculations. This continues until the last stage N+K is processed.

Once the last stage is processed 1020, traceback 1020 is performed. Transition bits that were generated by the VITSEL instructions and stored in memories during finalization 1018 of each stage processing are trace-backed from the last stage to the 1st stage to determine the decoded output bits. The VITTRACE instruction defined in Table 5 may be used to accelerate the traceback operation. In another embodiment, traceback may be performed using standard MCU instructions.

Figure 11:
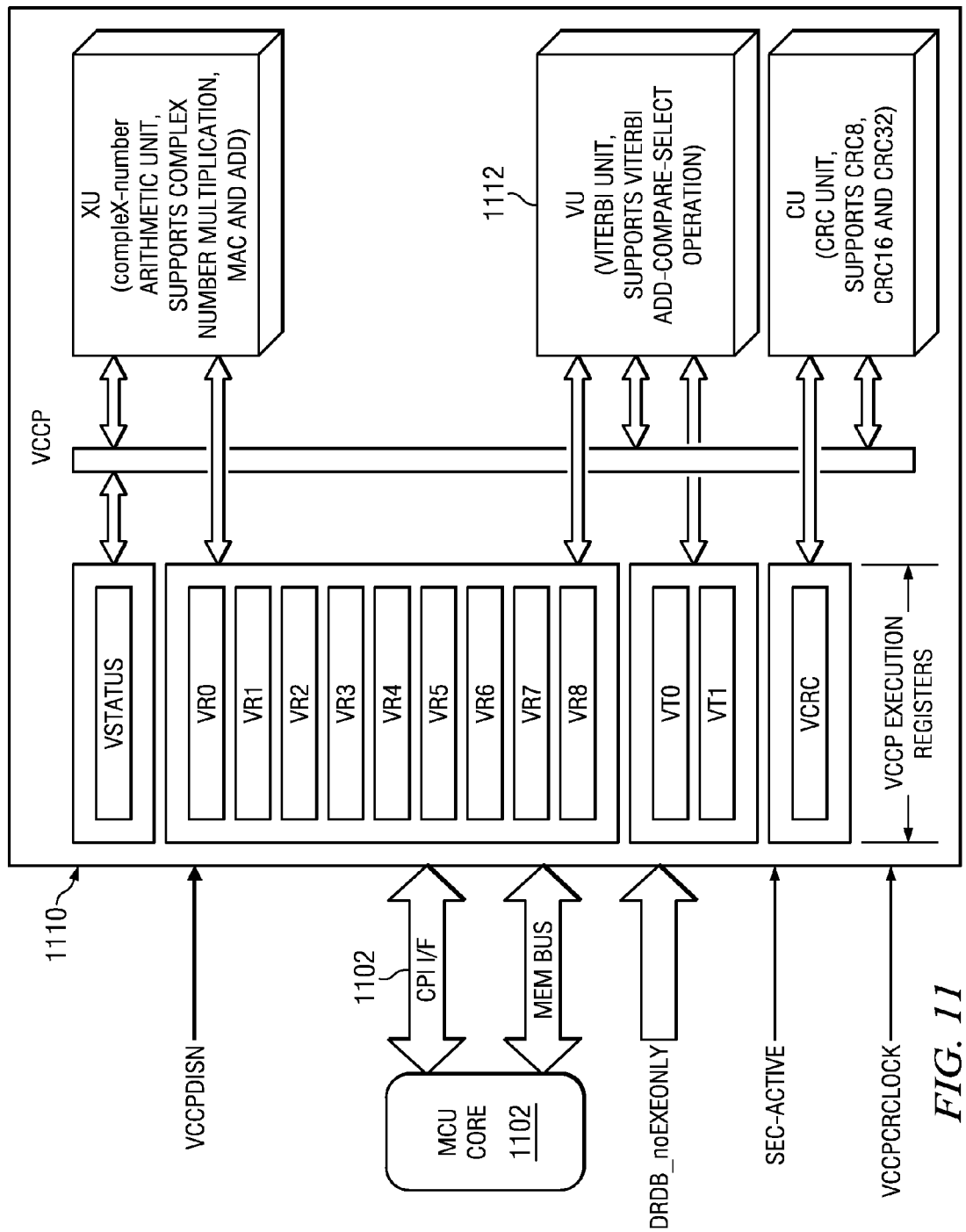
FIG. 11 is a block diagram of a coprocessor that supports a set of Viterbi instructions.

FIG. 11 is a block diagram of an exemplary Viterbi coprocessor 1110 that supports a set of Viterbi instructions as described above. In this embodiment, when an instruction decoder within MCU core processor 1102 decodes one of the set of Viterbi instructions, it transfers control to coprocessor 1110 and the Viterbi instruction is executed using logic within module 1112 that performs add, compare and select functions to implement the Viterbi instructions, as defined with regard to Tables 1-5. Coprocessor interface bus 1102 is used to transfer control and to provide an indication of which Viterbi instruction has been decoded. Dedicated Viterbi register VR0-VR8 are used to store intermediate butterfly SM and PM information. Dedicated trace registers VT0 and VT1 are used to store the transition bits as according to Table 5.

System Example

Figure 12:
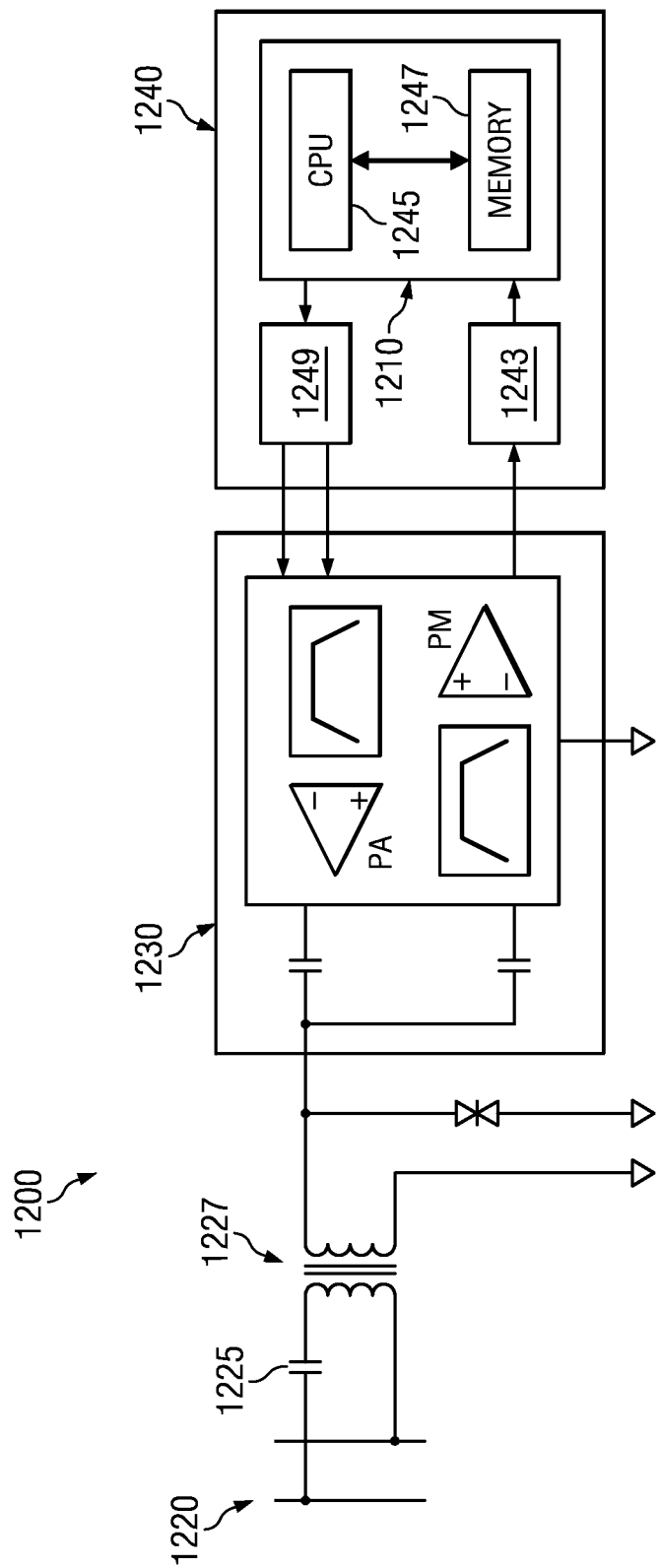
FIG. 12 is a block diagram of a smart meter that utilizes Viterbi decoding for communication via power lines.

FIG. 12 is a block diagram of a smart meter that utilizes Viterbi decoding for communication via power lines. Microcontroller 1210 includes a set of Viterbi instructions as described with regard to Tables 1-5 to accelerate Viterbi processing without adding significantly to the complexity of MCU 1210. This enhancement is particularly beneficial for resource intensive decoding, like Viterbi decoding. Other applications may include wireless communication for energy meters or the like. For this metering application, a data channel, or power line, 1220 may carry a power signal to a capacitor 1225 and transformer 1227. Transformer 1227 reduces a line voltage so that the analog front end chip 1230 can operate within its operating range. Analog front end 1230 receives this reduced voltage filters out the line voltage component of the frequency. Analog front end 1230 also extracts the band of frequency that is use for power line communication, according to the selected modulation technique. The analog front end 1230 may include any of several types of devices, such as band pass filters, amplifiers, capacitors, and the like.

An integrated circuit 1240 can process the filtered signal that it receives from analog front end 1230. Sampler 1243 is configured to select the input samples that are recovered during a demodulation process that correspond to noise encumbered convolutionaly encoded data that is being received via the communication channel 1220. The sampler 1243 can be any one of various types of samplers, such as an analog to digital converter or the like. As the sampler 1243 transmits the sampled signal, MCU 1210 receives this signal and may use resources from a central processing unit 1245 to execute instructions fetched from a memory device 1247 to perform Viterbi decoding of the received signal and thereby recover the original data, such as decoded data block 124 in FIG. 1. Once decoded, the MCU may then use the received information to perform control operations within the smart meter.

MCU 1210 may also collect status information relating to operation of the smart meter or other appliances or control modules connected to the smart meter. It may then perform convolution encoding as described above and transmit the encoded status information via a communication device, such as SPI (serial peripheral interface), UART, (universal asynchronous receiver/transmitter) or the like, that may be coupled to modulation device 1249. Modulation device 1249 may send the modulated status information to the analog front end 1230, which may then transmit the encoded status information to a remote data collection system via communication channel 1220.

In another embodiment, a set of Viterbi instructions may be defined that are organized in a different manner than suggested by Table 1-5. For example, Table 6 includes an expanded set of Viterbi instructions that perform essentially the same functions as described in Table 1-5, along with additional instructions to provide additional computational acceleration. An MCU that includes this set of instruction is described in more detail in "Concerto F28M35x Technical Reference Manual", Texas Instruments, Literature Number SPRUH22B, revised December 2011, which is incorporated by reference herein.

TABLE 6 another set of Viterbi instructions

VITBM2 VR0 - Code Rate 1:2 Branch Metric Calculation
VITBM2 VR0 || VMOV32 VR2, mem32 - Code Rate 1:2 Branch Metric Calculation with Parallel Load
VITBM3 VR0, VR1, VR2 - Code Rate 1:3 Branch Metric Calculation
VITBM3 VR0, VR1, VR2 || VMOV32 VR2, mem32 - Code Rate 1:3 Branch Metric Calculation with Parallel Load
VITDHADDSUB VR4, VR3, VR2, VRa - Viterbi Double Add and Subtract, High
VITDHADDSUB VR4, VR3, VR2, VRa || mem32 VRb - Viterbi Add and Subtract High with Parallel Store
VITDHSUBADD VR4, VR3, VR2, VRa - Viterbi Add and Subtract Low
VITDHSUBADD VR4, VR3, VR2, VRa || mem32 VRb - Viterbi Subtract and Add, High with Parallel Store
VITDLADDSUB VR4, VR3, VR2, VRa - Viterbi Add and Subtract Low
VITDLADDSUB VR4, VR3, VR2, VRa || mem32 VRb - Viterbi Add and Subtract Low with Parallel Load
VITDLSUBADD VR4, VR3, VR2, VRa - Viterbi Subtract and Add Low
VITDLSUBADD VR4, VR3, VR2, VRa || mem32 VRb - Viterbi Subtract and Add, Low with Parallel Store
VITHSEL VRa, VRb, VR4, VR3 - Viterbi Select High
VITHSEL VRa, VRb, VR4, VR3 || VMOV32 VR2, mem32 - Viterbi Select High with Parallel Load
VITLSEL VRa, VRb, VR4, VR3 - Viterbi Select, Low Word
VITLSEL VRa, VRb, VR4, VR3 || VMOV32 VR2, mem32 - Viterbi Select Low with Parallel Load
VTCLEAR - Clear Transition Bit Registers
VTRACE mem32, VR0, VT0, VT1 - Viterbi Traceback, Store to Memory
VTRACE VR1, VR0, VT0, VT1 - Viterbi Traceback, Store to Register Table 7 includes an example of code that may be executed by an MCU to perform a Viterbi decode process using specialized Viterbi processing instructions, as described in Tables 1-5. In this example, K=7, CR=½, and N=100. Of course, similar code for other embodiments may be written for different values of K, CR, and N. This code is written in a straight line manner for one stage, and then repeated in a loop. Other embodiments may use loops or other types of repetitive constructs within each stage. Similarly, a loop construct may be used during traceback.

Note, standard instructions are used to initialize the loop, then the set of Viterbi instructions are used to process the butterflies, and then standard instructions are used to finalize the data movement for each iteration of the loop. In another embodiment, additional specialized Viterbi instructions such as those included in Table 6 may be used to provide additional acceleration.

TABLE 7 example Viterbi decoder code for K = 7, CR = ½, N = 100

```
;;**********************************************************
;;
;;   Code: Viterbi Decoder
;;   Parameters:
;;      K = 7
;;      CR = ½
;;      Number of decode output bits = 100
;;**********************************************************
        MOV   @AR6,#99         ;set the LOOP count for 100 decoder output bits
        MOVL  XAR1,#OLD_PT     ;Points to old-state-metrics array
```

TABLE 7-continued example Viterbi decoder code for K = 7, CR = ½, N = 100

```
        MOVL XAR2,#0xf0          ;points to new-state-metrics array
        MOVL XAR0,#30            ;used for *+XAR2[AR0] addressing mode
        MOVL XAR3,#0x170         ;Points to the beginning of Trans array
        MOVL XAR4,#LLR           ;Points to the beginning of input LLR array
        ;Loop will run 100+K times
LOOP:
        MOV32 R0, *XAR4++        ;Load two LLR in R0L an R0H using 32-bit read
        VITBM2 R0 ||             ;Instruction to compute BM and initialize R0L and
R0H
        MOV32 R2, *XAR1++        ;Load SMs for next two consecutive old state
        ;0(M=1,1)
        VITPM TYPE1 R4,R3,R2,R0L    ;Calculate four PMs for butterfly 0
        VITSEL LOWER R6,R5,R4,R3 ||   ;Generate SM and T for butterfly 0
        MOV32 R2, *XAR1++
        ;1(M=1,-1)
        VITPM TYPE1 R4,R3,R2,R0H    ;Calculate four PMs for butterfly 1
        VITSEL UPPER R6,R5,R4,R3 ||   ;Generate SM and T for butterfly 1
        MOV32 R2, *XAR1++
        ;2(M=1,1)
        VITPM TYPE1 R4,R3,R2,R0L||   ;Calculate four PMs for butterfly 2
        MOV32 *XAR2++, R5
        VITSEL LOWER R8,R7,R4,R3 ||  ; Generate SM and T for butterfly 2
        MOV32 R2, *XAR1++
        ;3(M=1,-1)
        VITPM TYPE1 R4,R3,R2,R0H ||  ;Calculate four PMs for butterfly 3
        MOV32 *+XAR2[AR0], R6
        VITSEL UPPER R8,R7,R4,R3 ||  ;Calculate SM and T for butterfly 3
        MOV32 R2, *XAR1++
        ;4(M=-1,-1)
        VITPM TYPE2 R4,R3,R2,R0L||   ;Calculate four PMs for butterfly 4
        MOV32 *XAR2++, R7
        VITSEL LOWER R6,R5,R4,R3 ||  ;Calculate SM and T for butterfly 4
        MOV32 R2, *XAR1++
        ;5(M=-1,1)
        VITPM TYPE2 R4,R3,R2,R0H ||  ;Calculate four PMs for butterfly 5
        MOV32 *+XAR2[AR0], R8
        VITSEL UPPER R6,R5,R4,R3 ||  ;Calculate SM and T for butterfly 5
        MOV32 R2, *XAR1++
        ;6(M=-1,-1)
        VITPM TYPE2 R4,R3,R2,R0L||   ;Calculate four PMs for butterfly 6
        MOV32 *XAR2++, R5
        VITSEL LOWER R8,R7,R4,R3 ||  ;Calculate SM and T for butterfly 6
        MOV32 R2, *XAR1++
        ;7(M=-1,1)
        VITPM TYPE2 R4,R3,R2,R0H ||  ;Calculate four PMs for butterfly 7
        MOV32 *+XAR2[AR0], R6
        VITSEL UPPER R8,R7,R4,R3 ||  ;Calculate SM and T for butterfly 7
        MOV32 R2, *XAR1++
        ;8(M=-1,-1)
        VITPM TYPE2 R4,R3,R2,R0L||   ;Calculate four PMs for butterfly 8
        MOV32 *XAR2++, R7
        VITSEL LOWER R6,R5,R4,R3 ||  ;Calculate SM and T for butterfly 8
        MOV32 R2, *XAR1++
;;;;;;;;;;;;;;;;Similar code for butterflies 9-29;;;;;;;;;;;;;;;;;;;;
        ;30(M=-1,1)
        VITPM TYPE2 R4,R3,R2,R0H ||  ;Calculate four PMs for butterfly 30
        MOV32 *XAR2++, R5
        VITSEL LOWER R8,R7,R4,R3 ||  ;Calculate SM and T for butterfly 30
        MOV32 R2, *XAR1++
        ;31(M=-1,-1)
        VITPM TYPE2 R4,R3,R2,R0L||   ;Calculate four PMs for butterfly 31
        MOV32 *+XAR2[AR0], R6
        VITSEL UPPER R8,R7,R4,R3     ;Calculate SM and T for butterfly 31
        MOV32 *XAR2++, R7            ;finalize processing for this stage
        MOV32 *+XAR2[AR0], R8        ;Store the Transition bits in Trans[ ] Array
        MOV32 *XAR3++, T1
        MOV32 *XAR3++, T0
        ;Swap XAR1 and XAR2(old and new state pointers)
        SUBB XAR1,#64
        MOVL @XAR5,XAR1
        SUBB XAR2,#32
        MOVL @XAR1,XAR2
        MOVL @XAR2,XAR5
        ;set the LOOP count            ;repeat loop until the loop count goes to zero
        BANZ LOOP,AR6--
;;;;;;;;;;Viterbi Traceback logic;;;;;;;;;;;;;;;;;
        ;Initialize some traceback related registers
        VCLEAR R0
```

TABLE 7-continued example Viterbi decoder code for K = 7, CR = ½, N = 100

```
      MOVL XAR5,#0x320   ;Points to the beginning of Decoder Output array
      ;;For Viterbi stage = 100
          MOV32 T0, *--XAR3
          MOV32 T1, *--XAR3
          TRACE *XAR5++,R0,T0,T1
      ;;For Viterbi stage = 99
          MOV32 T0, *--XAR3
          MOV32 T1, *--XAR3
          TRACE *XAR5++,R0,T0,T1
      ;;For Viterbi stage = 98
          MOV32 T0, *--XAR3
          MOV32 T1, *--XAR3
          TRACE *XAR5++,R0,T0,T1
       ;;For Viterbi stage = 97
          MOV32 T0, *--XAR3
          MOV32 T1, *--XAR3
          TRACE *XAR5++,R0,T0,T1
       ;;For Viterbi stage = 96
          MOV32 T0, *--XAR3
          MOV32 T1, *--XAR3
          TRACE *XAR5++,R0,T0,T1
      ;;For Viterbi stage = 95
          MOV32 T0, *--XAR3
          MOV32 T1, *--XAR3
          TRACE *XAR5++,R0,T0,T1
      ;;For Viterbi stage = 94
          MOV32 T0, *--XAR3
          MOV32 T1, *--XAR3
          TRACE *XAR5++,R0,T0,T1
       ;;For Viterbi stage = 93
          MOV32 T0, *--XAR3
          MOV32 T1, *--XAR3
          TRACE *XAR5++,R0,T0,T1
;;;;;;;;;;;;;;;;similar traceback code for stages 92-4
   ;;For Viterbi stage = 3
          MOV32 T0, *--XAR3
          MOV32 T1, *--XAR3
          TRACE *XAR5++,R0,T0,T1
       ;;For Viterbi stage = 2
          MOV32 T0, *--XAR3
          MOV32 T1, *--XAR3
          TRACE *XAR5++,R0,T0,T1
       ;;For Viterbi stage = 1
          MOV32 T0, *--XAR3
          MOV32 T1, *--XAR3
          TRACE *XAR5++,R0,T0,T1
```

Other Embodiments

While the invention has been described with reference to illustrative embodiments, this description is not intended to be construed in a limiting sense. Various other embodiments of the invention will be apparent to persons skilled in the art upon reference to this description. For example, while a 32-bit MCU embodiment was described herein, other embodiments may use an MCU having a wider or narrow data path.

While a smart meter application was described, embedded MCUs with specialized Viterbi instructions to accelerate Viterbi decoding as described herein may be used in all manner applications that require low cost, low power dissipation, and Viterbi processing, such as machine control, automotive controllers, appliance controllers, etc.

In the Claims, specific instruction names and register numbers are not intended to be limiting, they are only used to help make the claims more readable and to distinguish different registers. Any instruction name may be used to designate the various Viterbi instructions. Register names and register numbers other than the exact values recited in the claims may be used.

Other embodiments may include a set of Viterbi instructions that are organized in a different manner than described herein. However, such embodiments will include instructions that are executed by an MCU or by a coprocessor coupled to an MCU that manipulate the state-metric data in a set of registers for Viterbi butterfly operations to form a final set of state-metric data and trace bits.

Embodiments of the Viterbi instructions described herein may be provided on any of several types of digital systems: digital signal processors (DSPs), general purpose programmable processors, application specific circuits, or systems on a chip (SoC) such as combinations of a DSP and a reduced instruction set (RISC) processor together with various specialized accelerators. A stored program in an onboard or external (flash EEP) ROM or FRAM may be used to implement aspects of the Viterbi decoding. Analog-to-digital converters and digital-to-analog converters provide coupling to the real world, modulators and demodulators (plus antennas for air interfaces) can provide coupling for waveform reception of communication data being broadcast over the air by satellite, TV stations, cellular networks, etc or via wired networks such as the Internet.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for performing Viterbi decoding on a microcontroller, the method comprising:
    initializing a state-metric array by executing load instructions to load state-metric data from a memory module into a set of registers in the microcontroller;
    performing butterfly processing of the state-metric array by executing a sequence of Viterbi processing instructions fetched from a program storage module to manipulate the state-metric (SM) data in the set of registers for a plurality of Viterbi butterfly operations to form a final set of state-metric data and trace bits for a Viterbi stage; and
    storing the final set of state-metric data for the Viterbi stage by executing store instructions to store the final set of state-metric data in the memory module;
    wherein executing a single Viterbi path metric (VITPM) Viterbi processing instruction fetched from the program storage module comprises:
    performing path metric (PM) computation for all four branches of a Viterbi butterfly; and updating the path metric computation results in a register;
    wherein executing a first type of a Viterbi path metric (VITPM) Viterbi processing instruction comprises:
    performing R3L=R2L+R1 to calculate path metric 1 (PM1);
    performing R3H=R2H−R1 to calculate path metric 2 (PM2);
    performing R4L=R2L−R1 to calculate path metric 3 (PM3); and
    performing R4H=R2H+R1 to calculate path metric 4 (PM4);
    where L indicates a lower half of register Rn and H indicates an upper half of register Rn.

2. A method for performing Viterbi decoding on a microcontroller, the method comprising:
    initializing a state-metric array by executing load instructions to load state-metric data from a memory module into a set of registers in the microcontroller;
    performing butterfly processing of the state-metric array by executing a sequence of Viterbi processing instructions fetched from a program storage module to manipulate the state-metric (SM) data in the set of registers for a plurality of Viterbi butterfly operations to form a final set of state-metric data and trace bits for a Viterbi stage; and
    storing the final set of state-metric data for the Viterbi stage by executing store instructions to store the final set of state-metric data in the memory module;
    wherein executing a single Viterbi path metric (VITPM) Viterbi processing instruction fetched from the program storage module comprises:
    performing path metric (PM) computation for all four branches of a Viterbi butterfly; and updating the path metric computation results in a register;
    wherein executing a second type of the Viterbi path metric (VITPM) Viterbi processing instruction comprises:
    performing R3L=R2L−R1 to calculate path metric 1 (PM1);
    performing R3H=R2H+R1 to calculate path metric 2 (PM2);
    performing R4L=R2L+R1 to calculate path metric 3 (PM3); and
    performing R4H=R2H−R1 to calculate path metric 4 (PM4);
    where L indicates a lower half of register Rn and H indicates an upper half of register Rn.

3. A method for performing Viterbi decoding on a microcontroller, the method comprising:
    initializing a state-metric array by executing load instructions to load state-metric data from a memory module into a set of registers in the microcontroller;
    performing butterfly processing of the state-metric array by executing a sequence of Viterbi processing instructions fetched from a program storage module to manipulate the state-metric (SM) data in the set of registers for a plurality of Viterbi butterfly operations to form a final set of state-metric data and trace bits for a Viterbi stage; and
    storing the final set of state-metric data for the Viterbi stage by executing store instructions to store the final set of state-metric data in the memory module;
    wherein executing a single Viterbi path metric (VITPM) Viterbi processing instruction fetched from the program storage module comprises:
    performing path metric (PM) computation for all four branches of a Viterbi butterfly; and updating the path metric computation results in a register;
    wherein executing Viterbi path metric (VITPM) Viterbi instruction further comprises writing a plurality of SM data to the memory module.

4. A method for performing Viterbi decoding on a microcontroller, the method comprising:
    initializing a state-metric array by executing load instructions to load state-metric data from a memory module into a set of registers in the microcontroller;
    performing butterfly processing of the state-metric array by executing a sequence of Viterbi processing instructions fetched from a program storage module to manipulate the state-metric (SM) data in the set of registers for a plurality of Viterbi butterfly operations to form a final set of state-metric data and trace bits for a Viterbi stage; and
    storing the final set of state-metric data for the Viterbi stage by executing store instructions to store the final set of state-metric data in the memory module;
    wherein executing a single Viterbi state-metric selection (VITSEL) Viterbi processing instruction fetched from the program storage comprises:

comparing a set of path metrics to generate both state metrics for a Viterbi butterfly and two corresponding trace (T) bits; and shifting a set of trace back registers and storing each T bit in a corresponding one of the set of trace back registers in a vacated bit location.

5. The method of claim 4, wherein executing a first type of Viterbi state-metric selection (VITSEL) Viterbi processing instruction comprises:

performing R5L=max(R4L, R4H) to determine SM data of a lower new state;

performing R6L=max(R5L, R5H) to determine SM data of an upper new state;

performing T0=T0<<1;

performing T1=T1<<1;

performing T0[0:0]=0 if (R4L>R4H) else 1 to determine T bit of the lower new state; and performing T1[0:0]=0 if (R5L>R5H) else 1 to determine T bit of the upper new state;

where L indicates a lower half of register Rn, H indicates an upper half of register Rn, and Tn indicates a traceback register.

6. The method of claim 5, wherein executing a second type of Viterbi state-metric selection (VITSEL) Viterbi processing instruction comprises:

performing R7H=max(R4L, R4H) to determine SM data of a lower new state;

performing R8H=max(R5L, R5H) to determine SM data of an upper new state;

performing T2=T2<<1;

performing T3=T3<<1;

performing T2[0:0]=0 if (R7L>R7H) else 1 to determine T bit of the lower new state; and performing T2[0:0]=0 if (R8L>R8H) else 1 to determine T bit of the upper new state;

where L indicates a lower half of register Rn, H indicates an upper half of register Rn, and Tn indicates a traceback register.

7. The method of claim 4, wherein executing Viterbi state-metric selection (VITSEL) Viterbi processing instruction further comprises:

loading the SM data of an old state for a next butterfly operation from an address location pointed by an address-register; and incrementing the address register.

8. A method for performing Viterbi decoding on a microcontroller, the method comprising:

initializing a state-metric array by executing load instructions to load state-metric data from a memory module into a set of registers in the microcontroller;

performing butterfly processing of the state-metric array by executing a sequence of Viterbi processing instructions fetched from a program storage module to manipulate the state-metric (SM) data in the set of registers for a plurality of Viterbi butterfly operations to form a final set of state-metric data and trace bits for a Viterbi stage; and storing the final set of state-metric data for the Viterbi stage by executing store instructions to store the final set of state-metric data in the memory module;

repeating the butterfly processing for all Viterbi stages corresponding to a block of data; and performing traceback over the trace bits of all the Viterbi stages by executing a sequence of Viterbi trace (VITTRACE) instructions fetched from a program storage module to process the trace bits stored in the memory module.

9. The method of claim 8, wherein executing a single VITTRACE instruction comprises calculating Next State (previous state)=$\mathrm{mod}_{(K-1)}(2*\mathrm{Current\_state}+\mathrm{Current\_T\_bit})$.

10. A microcontroller with an instruction processing pipeline, the instruction processing pipeline comprising:

an instruction fetch stage;

an instruction decoding stage coupled to receive instructions fetched from a program storage module;

an execution stage coupled to a set of registers and responsive to the instruction decoding stage; and wherein the instruction decoding stage and the execution stage are configured to execute a sequence of Viterbi processing instructions to manipulate state-metric data in the set of registers for a plurality of Viterbi butterfly operations to form a final set of state-metric data and trace bits;

wherein executing a single VITPM Viterbi processing instruction fetched from the program storage comprises:

performing path metric (PM) computation for all four branches of a Viterbi butterfly; and updating the path metric computation results in a register;

wherein executing VITPM Viterbi instruction further comprises writing a plurality of state metric (SM) to a memory module.

11. A microcontroller with an instruction processing pipeline, the instruction processing pipeline comprising:

an instruction fetch stage;

an instruction decoding stage coupled to receive instructions fetched from a program storage module;

an execution stage coupled to a set of registers and responsive to the instruction decoding stage; and wherein the instruction decoding stage and the execution stage are configured to execute a sequence of Viterbi processing instructions to manipulate state-metric data in the set of registers for a plurality of Viterbi butterfly operations to form a final set of state-metric data and trace bits;

wherein executing a single VITPM Viterbi processing instruction fetched from the program storage comprises:

performing path metric (PM) computation for all four branches of a Viterbi butterfly; and updating the path metric computation results in a register;

wherein executing a first type of VITPM Viterbi processing instruction comprises:

performing R3L=R2L+R1 to calculate path metric 1 (PM1);

performing R3H=R2H−R1 to calculate path metric 2 (PM2);

performing R4L=R2L−R1 to calculate path metric 3 (PM3); and performing R4H=R2H+R1 to calculate path metric 4 (PM4);

where L indicates a lower half of register Rn and H indicates an upper half of register.

12. A microcontroller with an instruction processing pipeline, the instruction processing pipeline comprising:

an instruction fetch stage;

an instruction decoding stage coupled to receive instructions fetched from a program storage module;

an execution stage coupled to a set of registers and responsive to the instruction decoding stage; and wherein the instruction decoding stage and the execution stage are configured to execute a sequence of Viterbi processing instructions to manipulate state-metric data in the set of registers for a plurality of Viterbi butterfly operations to form a final set of state-metric data and trace bits;

wherein executing a single Viterbi state-metric selection (VITSEL) Viterbi processing instruction fetched from program storage comprises:
  comparing a set of path metrics to generate both state metrics for a Viterbi butterfly and two corresponding trace (T) bits; and
  shifting a set of trace back registers and storing each T bit in a corresponding one of the set of trace back registers in a vacated bit location.

13. The microcontroller of claim 12, wherein executing Viterbi state-metric selection (VITSEL) Viterbi processing instruction further comprises:
  loading the state metric (SM) of an old state for a next butterfly operation from an address location pointed by an address-register; and
  incrementing an address register.

14. The microcontroller of claim 12, wherein executing a first type of Viterbi state-metric selection (VITSEL) Viterbi processing instruction comprises:
  performing R5L=max(R4L, R4H) to determine SM of a lower new state;
  performing R6L=max(R5L, R5H) to determine SM of an upper new state;
  performing T0=T0<<1;
  performing T1=T1<<1;
  performing T0[0:0]=0 if (R4L>R4H) else 1 to determine T bit of the lower new state; and
  performing T1[0:0]=0 if (R5L>R5H) else 1 to determine T bit of the upper new state;

where L indicates a lower half of register Rn, H indicates an upper half of register Rn, and Tn indicates a traceback register.

15. A microcontroller with an instruction processing pipeline, the instruction processing pipeline comprising:
  an instruction fetch stage;
  an instruction decoding stage coupled to receive instructions fetched from a program storage module;
  an execution stage coupled to a set of registers and responsive to the instruction decoding stage; and
  wherein the instruction decoding stage and the execution stage are configured to execute a sequence of Viterbi processing instructions to manipulate state-metric data in the set of registers for a plurality of Viterbi butterfly operations to form a final set of state-metric data and trace bits;
  wherein executing a sequence of Viterbi processing instructions further comprises:
  repeating the butterfly processing for all Viterbi stages corresponding to a block of data; and
  performing traceback over the trace bits of all the Viterbi stages by executing a sequence of Viterbi trace (VITTRACE) instructions fetched from a program storage module to process the trace bits stored in a memory module.

16. The microcontroller of claim 15, wherein executing a single VITTRACE instruction comprises calculating Next State (previous state)=$\mod_{(K-1)}(2*\text{Current\_state}+\text{Current\_T\_bit})$.

* * * * *